US010852581B2

United States Patent
Lee et al.

(10) Patent No.: US 10,852,581 B2
(45) Date of Patent: Dec. 1, 2020

(54) LIGHT UNIT AND DISPLAY DEVICE INCLUDING THE SAME

(71) Applicant: Samsung Display Co., Ltd., Yongin-si (KR)

(72) Inventors: Dong Hee Lee, Hwaseong-si (KR); Baek Hee Lee, Seoul (KR); Sun-Young Hong, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/537,743

(22) Filed: Aug. 12, 2019

(65) Prior Publication Data

US 2020/0117030 A1 Apr. 16, 2020

(30) Foreign Application Priority Data

Oct. 16, 2018 (KR) .......................... 10-2018-0123354

(51) Int. Cl.
*G02F 1/13357* (2006.01)
*F21V 8/00* (2006.01)

(52) U.S. Cl.
CPC ........... *G02F 1/1336* (2013.01); *G02B 6/005* (2013.01); *G02B 6/0088* (2013.01); *G02B 6/0055* (2013.01); *G02F 2001/133614* (2013.01)

(58) Field of Classification Search
CPC ...... G02B 6/005; G02B 6/0055; G02B 6/008; G02B 6/0033; G02F 2001/133614
See application file for complete search history.

(56) References Cited

U.S. PATENT DOCUMENTS

| 9,817,181 | B2 | 11/2017 | Fan | |
|---|---|---|---|---|
| 2013/0222911 | A1* | 8/2013 | Coggio | G02B 5/0242 359/493.01 |
| 2014/0119049 | A1 | 5/2014 | Kim et al. | |
| 2014/0319995 | A1* | 10/2014 | Kim | G02F 1/133512 313/501 |
| 2016/0003998 | A1* | 1/2016 | Benoit | G02F 1/133502 349/71 |
| 2016/0363713 | A1 | 12/2016 | Dubrow et al. | |
| 2017/0058199 | A1 | 3/2017 | Jang et al. | |
| 2018/0246373 | A1* | 8/2018 | Nakamura | G02B 5/3025 |

(Continued)

FOREIGN PATENT DOCUMENTS

| JP | 2016181474 | 10/2016 |
|---|---|---|
| KR | 1020160042250 | 4/2016 |

(Continued)

OTHER PUBLICATIONS

Extended European Search Report—European Patent Application No. 19203482.5. dated Dec. 20, 2019, citing references listed within.

*Primary Examiner* — Julie A Bannan
(74) *Attorney, Agent, or Firm* — Cantor Colburn LLP

(57) ABSTRACT

A light unit according to an exemplary embodiment includes a light source and an optical member transmitting and converting light emitted from the light source, where the optical member includes a light guide, a low refractive index layer disposed on the light guide and having a smaller refractive index than that of the light guide, and a wavelength conversion layer disposed on the low refractive index layer and including quantum dots, and the low refractive index layer includes a metal.

20 Claims, 12 Drawing Sheets

(56) References Cited

U.S. PATENT DOCUMENTS

| | | | |
|---|---|---|---|
| 2018/0252968 A1* | 9/2018 | Nakamura | G02F 1/133606 |
| 2019/0025621 A1* | 1/2019 | Shin | G02F 1/133528 |
| 2019/0064589 A1* | 2/2019 | Park | G02F 1/13394 |
| 2019/0079240 A1* | 3/2019 | Hwang | G02B 6/0055 |
| 2019/0121194 A1* | 4/2019 | Park | G02F 1/133502 |

FOREIGN PATENT DOCUMENTS

| | | |
|---|---|---|
| KR | 1020170014755 | 2/2017 |
| KR | 1020170034055 | 3/2017 |
| KR | 101767009 | 8/2017 |
| WO | 2014031726 | 2/2014 |

\* cited by examiner

LIGHT UNIT AND DISPLAY DEVICE INCLUDING THE SAME

This application claims priority to Korean Patent Application No. 10-2018-0123354 filed on Oct. 16, 2018, and all the benefits accruing therefrom under 35 U.S.C. § 119, the content of which in its entirety is herein incorporated by reference.

BACKGROUND

(a) Field

Exemplary embodiments of the invention relate to a light unit and a display device including the same.

(b) Description of the Related Art

A liquid crystal display ("LCD") includes a display panel including a liquid crystal layer positioned between two substrates. The LCD displays an image by controlling a direction of liquid crystal molecules of the liquid crystal layer and adjusting transmittance of light by a pixel unit. Since the display panel of the LCD is a non-emissive element, the LCD typically includes a light unit that provides light to the display panel from the back of the liquid crystal panel.

The light unit may include a light source such as a light emitting diode ("LED") and an optical member for uniformly transmitting light emitted from the light source to the display panel. Recently, a technique for applying quantum dots to the light unit has been developed. An application of quantum dots may provide a wide color gamut and improve color reproducibility. There are also multiple merits such as high peak luminance and reduced power consumption.

SUMMARY

Exemplary embodiments provide a light unit having improved characteristics and a display device including the same.

A light unit according to an exemplary embodiment includes a light source and an optical member which transmits and converts light emitted from the light source, where the optical member includes a light guide, a low refractive index layer disposed on the light guide and having a smaller refractive index than that of the light guide, and a wavelength conversion layer disposed on the low refractive index layer and including quantum dots, and the low refractive index layer includes a metal.

In an exemplary embodiment, a thickness of the low refractive index layer may be from about 30 angstroms to about 100 angstroms.

In an exemplary embodiment, the low refractive index layer may include at least one among silver (Ag), aluminum (Al), a copper-zinc (Cu—Zn) alloy, copper (Cu), and gold (Au).

In an exemplary embodiment, the optical member may further include a first capping layer disposed between the low refractive index layer and the wavelength conversion layer.

In an exemplary embodiment, the first capping layer may include at least one among a silicon nitride, a silicon oxide, an aluminum oxide, and a transparent metal oxide.

In an exemplary embodiment, the first capping layer may include argon (Ar).

In an exemplary embodiment, an opening is defined in the low refractive index layer.

In an exemplary embodiment, the low refractive index layer may include a plurality of regions having different densities from an area occupied by the opening.

In an exemplary embodiment, the optical member may include a light-incident portion adjacent to the light source and a light-facing portion separated from the light-incident portion, and an area occupied by an opening adjacent to the light-incident portion may be smaller than an area occupied by an opening adjacent to the light-facing portion.

In an exemplary embodiment, the optical member may include a light-incident portion adjacent to the light source and a light-facing portion separated from the light-incident portion, and a number of openings adjacent to the light-incident portion may be less than a number of openings adjacent to the light-facing portion.

A display device according to an exemplary embodiment includes a display panel and a light unit which supplies light to the display panel, where the light unit includes a light source and an optical member which transmits and converts the light emitted from the light source, the optical member includes a light guide, a low refractive index layer disposed on the light guide and including a metal, and a wavelength conversion layer disposed on the low refractive index layer and including a quantum dot, and a refractive index of the low refractive index layer is about 0.7 or less.

In an exemplary embodiment, a threshold angle of the light incident from the light guide to the low refractive index layer may be about 10 degrees or less.

According to the exemplary embodiments, the light unit having the improved optical characteristics and the display device including the same may be provided. The exemplary embodiments may provide the light unit with an improved light emission amount and excellent luminance, and the display device including the same.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
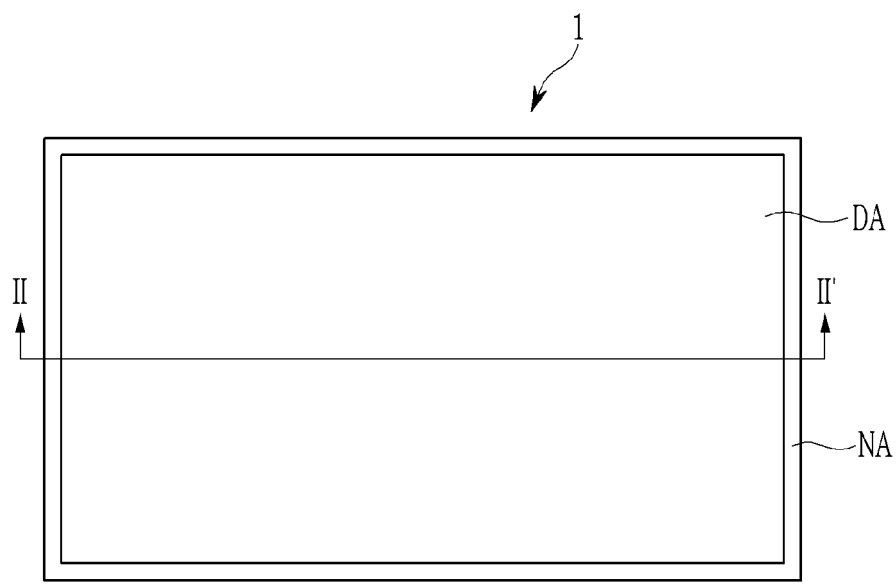
FIG. 1 is a view schematically showing an exemplary embodiment of a display device.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In describing the invention, parts that are not related to the description will be omitted. Like reference numerals generally designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout this specification, "in a plan view" means when a target part is viewed from the top, and "on a cross-section" means when a cross-section of the target part vertically taken is viewed from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Now, a display device according to an exemplary embodiment is described with reference to FIGS. 1 and 2. FIG. 1 is a view schematically showing a display device according to an exemplary embodiment, and FIG. 2 is a cross-sectional view taken along line II-II' of FIG. 1.

FIG. 1 schematically shows a front surface of the display device 1. In an exemplary embodiment, the display device 1 may be quadrangular as a whole, for example. However, the invention is not limited thereto, and in other exemplary embodiments, the display device 1 may have various other shapes. In display device 1, a display area DA in which an image is displayed occupies most of the entire region, and a non-display area NA surrounds the display area DA. The display area DA is referred to as a screen, and the non-display area NA is referred to as a bezel. Although the display device 1 and the display area are shown with four corners provided angularly, it is not limited thereto, and the corners may be rounded.

Figure 2:
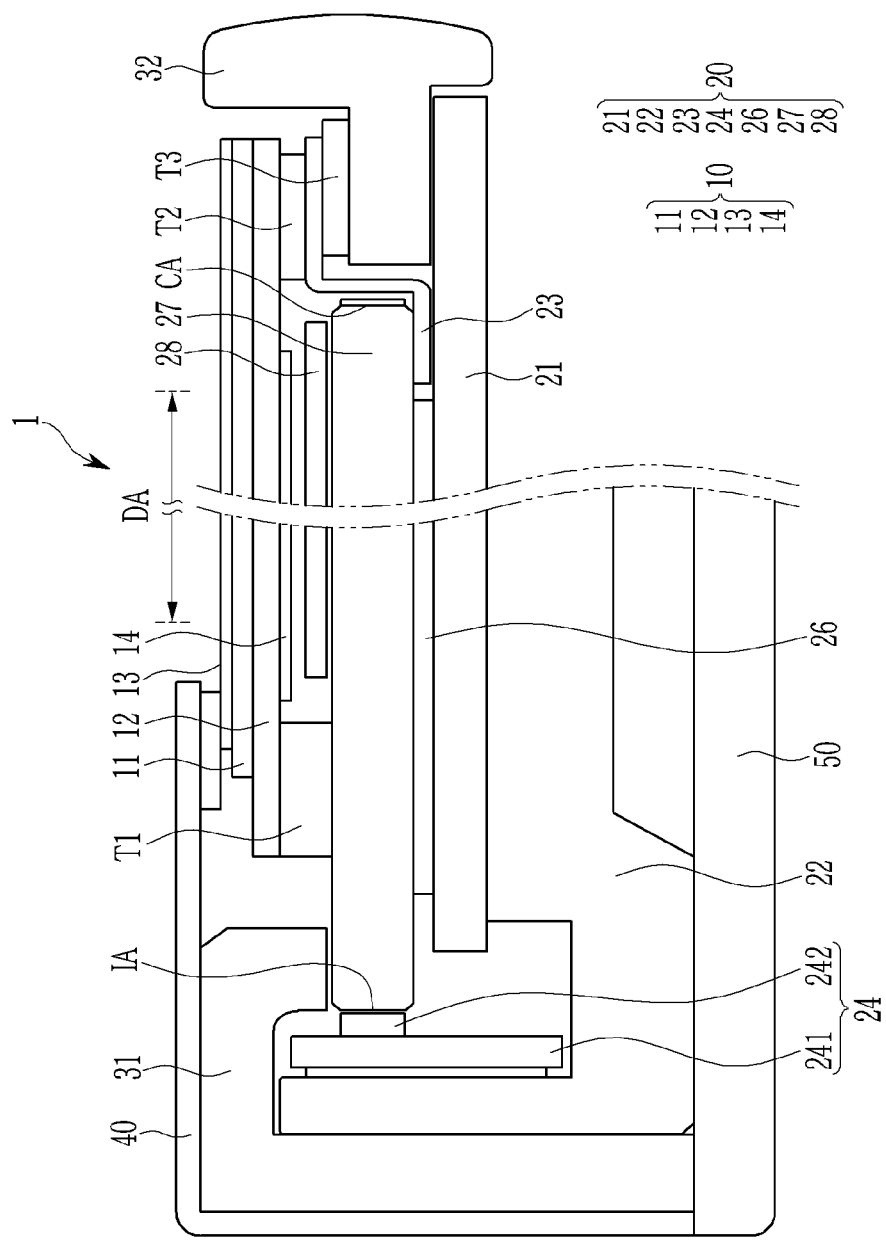
FIG. 2 is a cross-sectional view taken along line II-II' of FIG. 1.

FIG. 2 shows the cross-sectional view of the display device 1 shown in FIG. 1 taken along line II-II' direction, that is, a horizontal direction.

Referring to FIG. 2, a light source unit 24 is disposed at one side edge of the display device 1. In the display device 1, the vicinity of the edge where the light source unit 24 is disposed is referred to as a light-incident portion IA, and the vicinity of the edge where the light source unit 24 is not disposed corresponds to the light-incident portion IA and is referred to as a light-facing portion CA. FIG. 2 shows an exemplary embodiment in which one surface of the optical member 27 is the light-incident portion IA and the other surface facing one surface is the light-facing portion CA. However, it is not limited thereto, and the light-incident portion IA may refer to the vicinity of the region where the light source unit 24 is disposed, and the light-facing portion CA may refer to the region adjacent to the region facing opposite to the region.

The light source unit 24 may be disposed at least one edge of the display device 1, but is not limited thereto.

Referring to FIGS. 1 and 2, the display device 1 basically includes a display panel 10 and a light unit 20. The display device 1 includes frames 31 and 32 to fix the display panel 10 to the light unit 20 between the display panel 10 and the light unit 20. The display device 1 includes a top chassis 40 protecting the display panel 10 while covering the edge of the display panel 10 and preventing the display panel 10 from being separated from the light unit 20. The top chassis 40 may be disposed only at the edge of the display device 1 where the light source unit 24 is located, or around all edges of the display device 1. At the back of the light unit 20, a back cover 50 covering a driving device, a power supply, etc., for operating the display device 1 is disposed.

The display panel 10 is a liquid crystal panel including a liquid crystal layer disposed between two transparent substrates 11 and 12, on which switching elements, electrodes, color filters, etc., are provided. The display panel 10 includes polarization layers 13 and 14 disposed on respective surfaces of the substrates 11 and 12. The display panel 10 controls a transmittance of light provided by the light unit 20 and passing through the polarizers 13 and 14, and the liquid crystal layer under the control of the driving device, to display an image.

The light unit 20 supplying the light to the display panel 10 is disposed under the display panel 10. The light unit 20 includes a bottom chassis 21, a support 22, a bracket 23, the light source unit 24 and a reflective sheet 26, an optical member 27, and an optical sheet 28.

The bottom chassis 21 is a container in which the constituent elements of the light unit 20 are placed or fixed. In an exemplary embodiment, the bottom chassis 21 may have a shape such as a rectangular tray as a whole, for example.

In an exemplary embodiment, the bottom chassis 21 may include a metal material such as aluminum, an aluminum alloy, or a galvanized steel sheet. In an exemplary embodiment, the bottom chassis 21 may include a plastic material such as a polycarbonate.

Optical elements including the reflective sheet 26, the optical member 27, and the optical sheet 28 are disposed on the bottom chassis 21. The support 22 to which the light source unit 24 is disposed is provided at the base of the bottom chassis 21 in the region adjacent to the light-incident portion IA. The bracket 23 supporting the optical member 27 is disposed on the bottom chassis 21 in the region adjacent to the light-facing portion CA.

The support 22 is a kind of heat dissipation part for fixing the light source unit 24 and simultaneously transmitting heat generated from the light source unit 24 to the bottom chassis 21. The support 22 may include a metal material with good thermal conductivity to quickly transfer the heat generated from the light source unit 24 to the bottom chassis 21 to prevent the light source unit 24 from overheating. In an exemplary embodiment, the support 22 may be provided by extrusion molding with aluminum, an aluminum alloy, or the like, for example.

The light source unit 24 includes a substrate 241 disposed to be elongated along the light-incident portion IA, and a light source 242 disposed at a predetermined interval therefrom on the substrate 241. In an exemplary embodiment, the substrate 241 may be a printed circuit board ("PCB"), particularly a metal core printed circuit board ("MCPCB"), for example. The substrate 241 may be fixed to the support 22. The light source 242 is electrically connected to wiring of the substrate 241, and receives power to convert electrical energy into light energy to be emitted. The light source 242 may be a light emitting diode ("LED") package, and the LED may emit blue light with high color purity. In an exemplary embodiment, the blue light may mean light with a wavelength of about 440 nanometers to about 485 nanometers, for example. In an exemplary embodiment, an LED may emit blue light with a peak wavelength at about 445 nanometers to 450 nanometers, for example. The light source 242 is disposed so that a light emitting surface faces the optical member 27. In addition to the LED package, a point light source or a line light source may be used as the light source 242.

The optical member 27 is used to guide the light emitted from the light source 242 and transmit it to the display panel 10. The optical member 27 has a function of converting the light having an optical distribution in the form of the point light source or the line light source generated from the light source unit 24 into light having an optical distribution in the form of a surface light source, that is, of distributing the light evenly.

The optical member 27 may also convert the wavelength of the light emitted by the light source 242. The optical member 27 may be larger than the display area DA when viewed from the front, so that the light may be provided to an entirety of the display area DA of the display device 1.

The reflective sheet 26 may be disposed under the optical member 27, that is, between the optical member 27 and the bottom chassis 21. The reflective sheet 26 reflects light traveling down the optical member 27 and ultimately directs it toward the display panel 10, thereby increasing light efficiency.

The optical sheet 28 may be disposed above the optical member 27. The optical sheet 28 may include at least one among a diffuser sheet, a prism sheet, and a protecting sheet. The diffuser sheet is used to scatter the light from the optical member 27 to make the luminance distribution uniform, that is, to make the surface light source have uniform brightness. The prism sheet adjusts the traveling direction of light diffused by the diffuser sheet so as to be perpendicular to the display panel 10. The protecting sheet may be used to protect a prism of the prism sheet from scratches and the like. The protective sheet may also spread the light and widen the viewing angle that is narrowed by the prism sheet. The optical sheet 28 may not include any of the diffuser sheet, the prism sheet, and the protecting sheet, or it may include a plurality of such sheets. The optical sheet 28 may further include a reflective polarization sheet capable of increasing luminance efficiency by separating polarization components of light to be transmitted and reflected.

For the frames 31 and 32 to stably fix the display panel 10, the frame 31 disposed adjacent to the light-incident portion IA and the frame 32 disposed adjacent to the light-facing portion CA may be structurally different. The display panel 10 may be attached to the optical member 27 and the bracket 23 by adhesion members T1, T2, and T3 such as a double-sided adhesive tape to not be moved.

So far, the overall configuration of the display device 1 was described. Now, the optical member 27 of the light unit 20 in the display device 1 according to an exemplary embodiment will be described in detail. Even when there is no particular mention below, the drawings referred to earlier may also be referred to.

Figure 3:
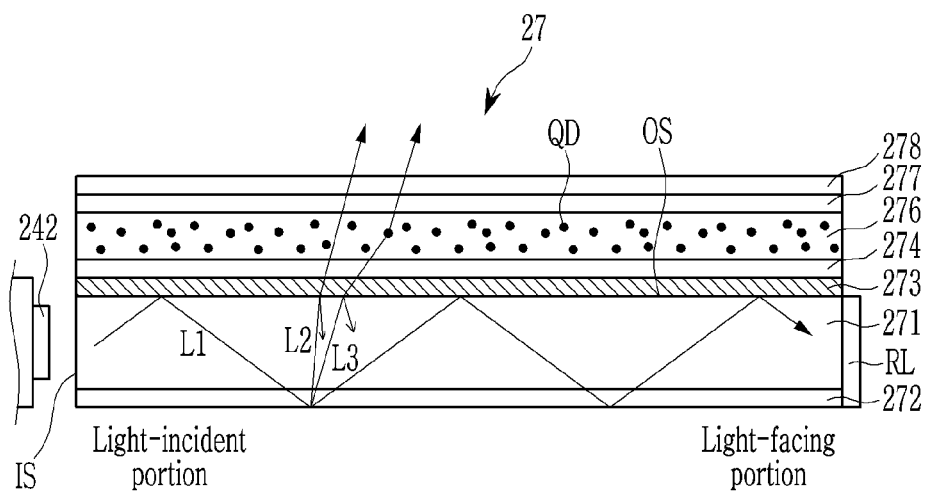
FIG. 3 is a cross-sectional view of an exemplary embodiment of an optical member.

FIG. 3 is a cross-sectional view of an optical member according to an exemplary embodiment. FIG. 3 shows the light source 242 along with the optical member 27 to show the relationship of the optical member 27 and the light source 242.

Referring to FIG. 3, the optical member 27 includes a light guide 271 as a main configuration to provide the light from the light source 242 to the display panel 10. The vicinity of the edge adjacent to the light source 242 in the light guide 271 is referred to as the light-incident portion, and the vicinity of the edge away from the light source 242 facing the light-incident portion is referred to as the light-facing portion.

The optical member 27 also includes a low refractive index layer 273, a first capping layer 274, a wavelength conversion layer 276, a second capping layer 277, and an overcoat layer 278 that are sequentially stacked on the light guide 271.

The light guide 271 guides the path of light emitted from the light source 242. The light guide 271 may be a glass light guide. The glass light guide is less deformed by heat and moisture than a plastic light guide including polymethylmethacrylate ("PMMA"), which has a high strength merit.

When using the glass light guide, design freedom of the light unit 20 increases, thereby providing a thinner light unit 20 and display device 1. In an exemplary embodiment, the glass material of the light guide 271 may be a silica-based glass, and may include silicon dioxide ($SiO_2$), aluminum oxide ($Al_2O_3$), or the like as a main component, for example. In an exemplary embodiment, the light guide 271 may have a thickness of about 0.5 millimeter (mm) to about 3 mm, however it is not limited thereto.

A pattern sheet 272 is disposed under the light guide 271, and the low refractive index layer 273 having a smaller refractive index than that of the light guide 271 is disposed on the light guide 271. The drawings show the exemplary embodiment in which the pattern sheet 272 has a simple planar shape, however it is not limited thereto, and the pattern sheet 272 may have a shape including a plurality of protrusions and depressions.

The low refractive index layer 273 may include a metal. As an example, the low refractive index layer 273 may be a metal thin film. In an exemplary embodiment, the low refractive index layer 273 may include at least one kind of metal, and as an example, at least one of silver (Ag), aluminum (Al), a copper-zinc (Cu—Zn) alloy, and copper (Cu) may be included. In an exemplary embodiment, the low refractive index layer 273 may include silver (Ag) or aluminum (Al) as an example. The metal included in the low refractive index layer 273 is not limited to the above-described metal.

In an exemplary embodiment, silver (Ag) for the blue LED having a wavelength of light of about 450 nanometers may have a refractive index of about 0.14, aluminum (Al) may have a refractive index of about 0.61, the copper-zinc alloy may have a refractive index of about 1.09, copper (Cu) may have a refractive index of about 1.31, and gold (Au) may have a refractive index of about 1.37.

The low refractive index layer 273 may be provided through a sputtering process. Adherence of the low refractive index layer 273 provided through the sputtering process and the light guide 271 may be excellent.

When including the low refractive index layer 273 of the metal material, since the optical member 27 includes a conductive layer, it is possible to prevent static electricity from remaining or accumulating in some regions and to prevent the static electricity from flowing into the display panel.

In an exemplary embodiment, the thickness of the low refractive index layer 273 may be about 30 angstroms to about 100 angstroms, for example. When the thickness of the low refractive index layer 273 is less than about 30 angstroms, metal flocculation may occur in the process of forming the low refractive index layer 273. In the process of forming the metal layer, it may be difficult to provide the uniform low refractive index layer 273 because the metal is aggregated in some regions. When the thickness of the low refractive index layer 273 is greater than about 100 angstroms, the transmittance of the low refractive index layer 273 may be low. In an exemplary embodiment, the light passing through the light guide 271 must be provided to the display panel through the low refractive index layer 273, and when the thickness of the low refractive index layer 273 is greater than about 100 angstroms, the light amount provided to the display panel may be reduced because it is difficult to be transmitted to the low refractive index layer 273.

A first interface having the refractive index difference is disposed between the low refractive index layer 273 and the light guide 271. The first interface corresponds a light emission surface OS of the light guide 271, and functions as an interface for selectively emitting light L1 guided in the light guide 271. When an incident angle into the light emission surface OS of the light L1 guided in the light guide 271 is above the total reflection threshold angle, the light L1 is totally reflected from the first interface and returned in the light guide 271. When the incident angle into the light emission surface OS of the light L2 and L3 guided in the light guide 271 is below the total reflection threshold angle, at least some of the light L2 and L3 may pass through the first interface and exit the light guide 271.

The low refractive index layer 273 may include silver (Ag) as an example. In an exemplary embodiment, silver (Ag) of the thin film shape may have a refractive index of about 0.14 to about 0.2 for a blue LED having a wavelength of the light of about 450 nanometers. In an exemplary embodiment, the refractive index of the light guide 271 of the glass material may be about 1.4 to about 1.5. When the light guide 271 and the low refractive index layer 273 have the refractive index as described above, the threshold angle of light incident from the light guide 271 toward the low refractive index layer 273 may be less than about 10 degrees (°), and according to an exemplary embodiment, the threshold angle may be less than about 8 degrees (°). The total reflection may occur when the incident angle of the light incident from the light guide 271 toward the low refractive index layer 273 is about 10 degrees or more, or for example, the total reflection may occur when the incident angle is about 8 degrees or more. Accordingly, most of the light incident on the light guide 271 from the light source 242 may be totally reflected. As the refractive index difference between the light guide 271 and the low refractive index layer 273 is increased, the threshold angle may be smaller, and thus the totally reflected light intensity within the light guide 271 may be increased.

The totally reflected light in the light emission surface OS is again reflected by the pattern sheet 272 or the reflection sheet to be toward the light emission surface OS, and may exit the light guide 271 when the incident angle with respect to the light emission surface OS is less than the threshold angle.

In an exemplary embodiment, most of the light traveling from the light source 242 towards the light guide 271 may be totally reflected. In this way, the totally reflected light may be incident toward the wavelength conversion layer 276 and the display panel through the light emission surface OS, so that the emitted light amount and the luminance of the wavelength conversion layer 276 may be increased.

In addition, the light leakage phenomenon may occur in the light guide 271 adjacent to the light-incident portion, but since the optical member 27 according to an exemplary embodiment has the considerably small threshold angle, most of the incident light may be totally reflected, the light leakage phenomenon in the portion may be improved.

An air layer is disposed below the pattern sheet 272 and a second interface having the refractive index difference is disposed between the pattern sheet 272 and the air layer. The pattern on the pattern sheet 272 adjusts the reflection angle of the light L1 guided in the light guide 271 so that the light L2 and L3, reflected or scattered by the second interface, for example, is not totally reflected in the first interface and at least part may exit the light guide 271. In another exemplary embodiment, the pattern sheet 272 may be omitted, and a lower surface of the light guide 271 may be patterned instead.

Accordingly, the light L1 incident on the light incident surface IS of the light guide 271 is guided in the light guide 271 from the light-incident portion to the light-facing portion, and exits through the entire light-facing surface OS of the light guide 271. Therefore, the light guide 271 converts the light having the optical distribution in the form of the point light source or the linear light source generated by the light source 242 into the light having the optical distribution in the form of the surface light source. A reflective layer RL may cover a lateral surface of the light-facing portion of the light guide 271 so that the light guided in the light guide 271 does not pass through the lateral surface of the light-facing portion of the light guide 271.

The first capping layer 274 and the wavelength conversion layer 276 are sequentially disposed on the low refractive index layer 273.

The first capping layer 274 may be disposed between the wavelength conversion layer 276 and the low refractive index layer 273 to prevent impurities from penetrating into the wavelength conversion layer 276. The first capping layer 274 may prevent moisture or oxygen from penetrating into the wavelength conversion layer 276.

In an exemplary embodiment, the first capping layer 274 may include at least one among a silicon nitride (SiNx), a silicon oxide (SiOx), an aluminum oxide (AlOx), and a transparent metal oxide. In an exemplary embodiment, the transport metal oxide may include a metal oxide such as an indium-zinc oxide ("IZO"), an indium oxide (InOx), a zinc oxide (ZnOx), a zirconium oxide (ZrOx), an indium-tin oxide ("ITO"), an indium-gallium-zinc oxide ("IGZO"), an indium-tin-zinc oxide ("ITZO"), an indium-tin-gallium-zinc oxide ("ITGZO"), and the like, but it is not limited thereto.

The first capping layer 274 may include argon (Ar) according to an exemplary embodiment. The first capping layer 274 may be provided through a process subsequent to the process for forming the low refractive index layer 273 according to an exemplary embodiment. In an exemplary embodiment, the process atmosphere may include an inactive gas for forming plasma, for example, argon gas. In this argon gas atmosphere, the first capping layer 274 provided through the sputtering process may include argon (Ar). However, the invention is not limited thereto, and the type of elements included in the first capping layer 274 may vary depending on the type of the inactive gas included in the manufacturing process. That is, the first capping layer 274 may include the material corresponding to the inactive gas used in the manufacturing process. The first capping layer 274 may be fabricated through the continuous process with the low refractive index layer 273, thus reducing the manufacturing time and cost.

The wavelength conversion layer 276 is disposed on the first capping layer 274. The wavelength conversion layer 276 may be provided by coating a composition in which quantum dots QD are dispersed in a dispersion medium on the first capping layer 274.

As the dispersion medium, a transparent material with a low absorption rate of light may be used without affecting the wavelength conversion performance of the quantum dots QD, for example epoxy, silicone, polystyrene, acrylate, etc.

In an exemplary embodiment, the quantum dots QD of the wavelength conversion layer 276 may include red quantum dots and green quantum dots, for example. In an exemplary embodiment, the red quantum dots convert blue light into red light of a wavelength of about 620 nanometers to about 750 nanometers, for example. In an exemplary embodiment, the green quantum dots convert blue light into green light of a wavelength of about 495 nanometers to about 570 nanometers, for example. The blue light, which is not converted to red light or green light, passes through the wavelength conversion layer 276 as it is. The optical member 27 may provide white light to the display panel 10 by mixing blue light, red light, and green light through the wavelength conversion layer 276.

The second capping layer 277 is disposed on the wavelength conversion layer 276, and the overcoat layer 278 is disposed on the second capping layer 277. The second capping layer 277 may include an inorganic material such as a silicon nitride and a silicon oxide, and the overcoat layer 278 may include an organic material. The second capping layer 277 may prevent the organic material of the wavelength conversion layer 276 and the organic material of the overcoat layer 278 from being mixed. The second capping layer 277 may block moisture or oxygen from penetrating. The overcoat layer 278 may protect the optical member 27 as a whole. In another exemplary embodiment, at least one of the second capping layer 277 and the overcoat layer 278 may be omitted.

Figure 4:
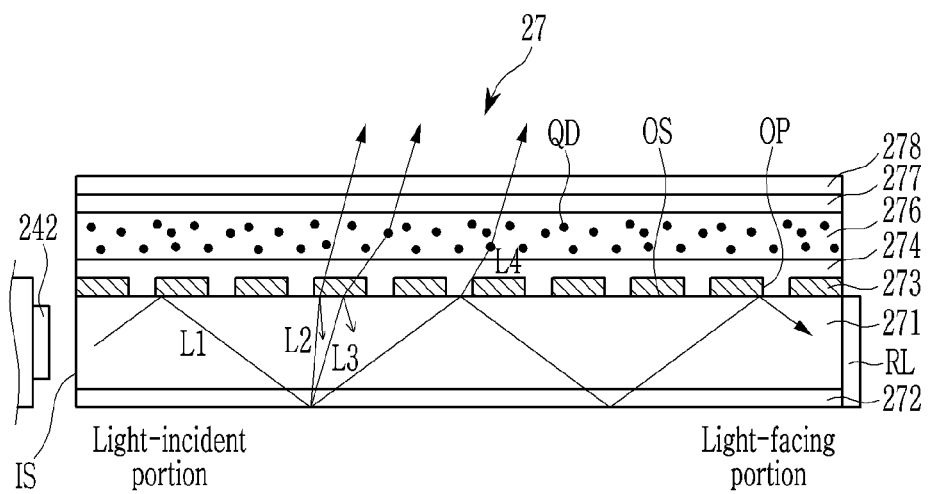
FIG. 4 is a cross-sectional view of an exemplary embodiment of an optical member.
Figure 5:
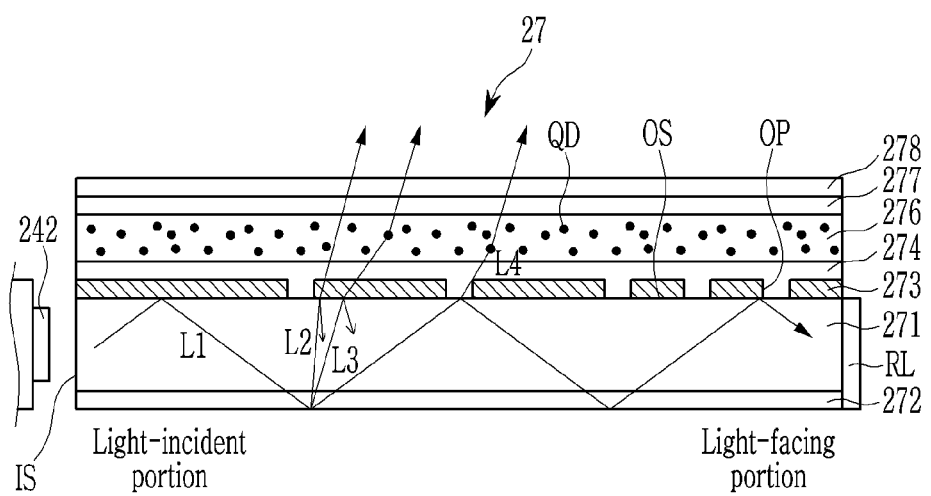
FIG. 5 is a cross-sectional view of an exemplary embodiment of an optical member.
Figure 6:
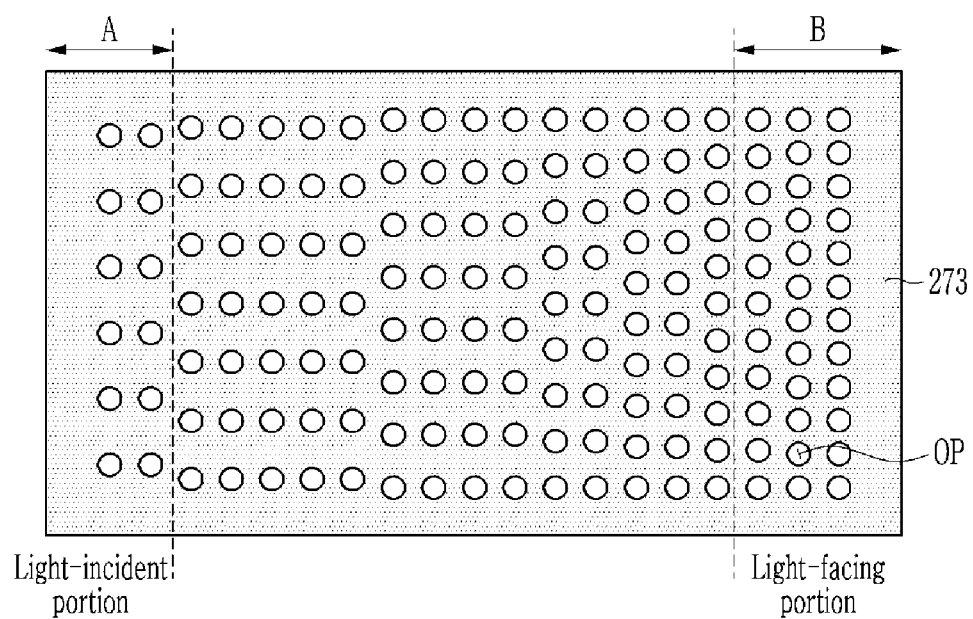
FIG. 6 is a top plan view of an exemplary embodiment of a low refractive index layer.
Figure 7:
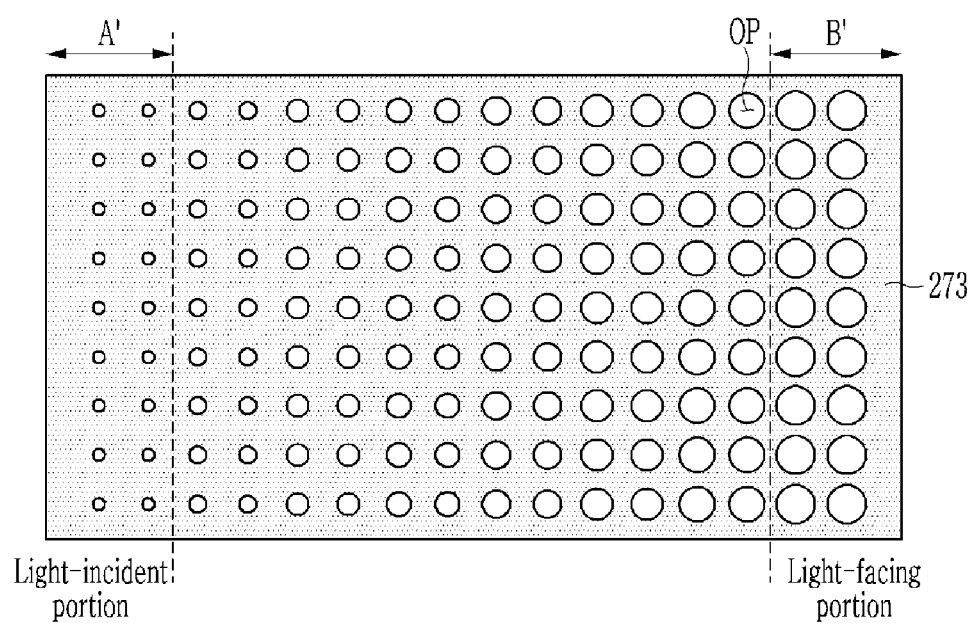
FIG. 7 is a top plan view of an exemplary embodiment of a low refractive index layer.
Figure 8:
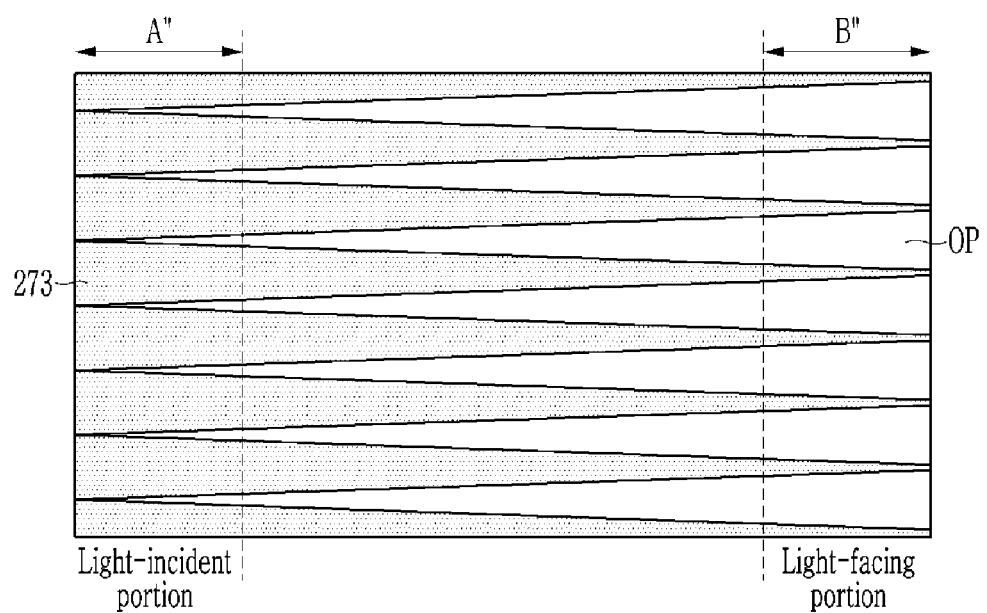
FIG. 8 is a top plan view of an exemplary embodiment of a low refractive index layer.

Next, the low refractive index layer according to an exemplary embodiment is described with reference to FIGS. 4 to 8. FIG. 4 is a cross-sectional view of an exemplary embodiment of an optical member, FIG. 5 is a cross-sectional view of an exemplary embodiment of an optical member, and FIGS. 6, 7 and 8 are top plan views of exemplary embodiments of a low refractive index layer, respectively. Descriptions of the same and similar constituent elements as the above-mentioned constituent elements are omitted, and differentiating configurations are mainly described.

First, referring to FIG. 4, a plurality of openings OP may be defined in the low refractive index layer 273 according to an exemplary embodiment. The plurality of openings OP may be defined with a uniform size and interval over the entire region of the low refractive index layer 273. The size and interval may vary depending on the device.

In an exemplary embodiment, the low refractive index layer 273 may include the metal, and for example, may include at least one among silver (Ag), aluminum (Al), a copper-zinc (Cu—Zn) alloy, copper (Cu), and gold (Au).

In an exemplary embodiment, the threshold angle of the light incident toward the low refractive index layer 273 from the light guide 271 may be about 10 degrees (°) or less, for example, about 8 degrees (°) or less. The total reflection may occur when the incident angle of the light incident from the light guide 271 toward the low refractive index layer 273 is about 10 degrees or more, for example, the total reflection may occur when the incident angle is about 8 degrees or more.

When the low refractive index layer 273 includes the metal thin film, most of the light incident from the light source may be totally reflected in the light guide 271 according to an exemplary embodiment. In an exemplary embodiment, as a plurality of openings OP is defined in the low refractive index layer 273, some of the light L4 may be emitted through the opening OP without the total reflection. The amount of the light emitted from the light guide 271 may thereby be increased.

The first capping layer 274 is disposed on the low refractive index layer 273. The first capping layer 274 may also be disposed in the opening OP defined in the low refractive index layer 273. The first capping layer 274 may have the form of filling a plurality of openings OP.

Next, referring to FIG. 5, a plurality of openings OP may be defined in the low refractive index layer 273. In an exemplary embodiment, the distance between the plurality of openings OP may be different. In an exemplary embodiment, as shown in FIG. 5, the distance between the openings OP adjacent to the light-incident portion may be greater than the distance between the openings OP adjacent to the light-facing portion, for example. A plurality of openings OP located at the light-incident portion may be relatively small compared to a plurality of openings OP located at the light-facing portion. In other words, the density of the area of the opening OP located in the light-incident portion may be less than the density of the area of the opening OP located in the light-facing portion. Fewer openings OP may be defined in the low refractive index layer 273 adjacent to the light-incident portion for the same area than those of the low refractive index layer 273 adjacent to the light-facing portion.

The light-incident portion may receive a relatively large amount of incident light compared to the light-facing portion. The light-incident portion is disposed adjacent to the light source 242, and a large amount of light is incident from the light source 242. When the area of the opening OP adjacent to the light-facing portion is large, the amount of light emitted from the region adjacent to the light-facing portion may be greater than the amount of light emitted from the region adjacent to the light-incident portion. However, since light incident from the light source 242 at the light-incident portion is large, the amount of light emitted through the low refractive index layer 273 may be large even though the light is not emitted through the opening OP. Therefore, the amount of light emitted from the light guide 271 may be uniform overall.

Next, referring to FIG. 6, a plurality of openings OP may be defined in the low refractive index layer 273. FIG. 6 shows an exemplary embodiment in which the opening OP is circular in a plan view, but it is not limited thereto, and any shape such as a polygon, a circle, and an ellipse may be used. The specification also shows an exemplary embodiment in which a plurality of openings OP is irregularly arranged, but it is not limited thereto, and in another exemplary embodiment, a plurality of openings OP may be arranged regularly.

Depending on the example, the number of openings OP adjacent to the light-incident portion may be less than the number of openings OP adjacent to the light-facing portion. The number of the openings OP in the same area may be increased towards the light-facing portion in the light-incident portion. In an exemplary embodiment, in the regions A and B with the same area, twelve openings OP may be disposed in the region A, which is disposed adjacent to the light-incident portion, for example. In the exemplary embodiment, thirty six openings OP may be disposed in the region B adjacent to the light-facing portion, for example.

In other words, with respect to the same area, the plane area occupied by a plurality of openings OP in the low refractive index layer 273 adjacent to the light-facing portion may be larger than the plane area occupied by the openings OP in the low refractive index layer 273 adjacent to the light-incident portion.

The amount of light emitted through a plurality of openings OP adjacent to the light-facing portion may be greater than the amount of light emitted through a plurality of openings OP adjacent to the light-incident portion. However, since the amount of light incident from the light source 242 in the light-incident portion is large, the amount of light emitted through the low refractive index layer 273 may be large even when the light is not emitted through the opening OP. The amount of light emitted from the entire light guide 271 may be uniform.

Next, referring to FIG. 7, a plurality of openings OP may be defined in the low refractive index layer 273. FIG. 7 shows an exemplary embodiment in which the opening OP is circular in a plan view, but it is not limited thereto, and any shape such as a polygon, a circle, and an ellipse may be used.

In the exemplary embodiment, the area of one opening OP adjacent to the light-incident portion and the area of one opening OP adjacent to the light-facing portion may be different. As shown in FIG. 7, the plane area of one opening OP adjacent to the light-incident portion may be smaller than the plane area of one opening OP adjacent to the light-facing portion.

When the area of one opening OP adjacent to the light-facing portion is relatively large, the amount of light emitted through the opening OP adjacent to the light-facing portion with respect to the same area A' and B' may be greater than the amount of light emitted through the opening OP adjacent to the incident portion.

However, since the amount of light incident from the light source 242 at the light-incident portion is large, the amount of light emitted through the low refractive index layer 273 may be large even though the light is not emitted through the opening OP. The amount of light emitted from the entire light guide 271 may be uniform.

Next, referring to FIG. 8, a plurality of openings OP may be defined in the low refractive index layer 273. The opening OP may have a shape that is continuously connected from the light-incident portion to the light-facing portion. FIG. 8 shows a preferred embodiment in which the opening OP includes the edge extending in the diagonal direction in a plan view, but it is not limited to this form.

In the exemplary embodiment, the area occupied by the opening OP adjacent to the light-incident portion and the area occupied by the opening OP adjacent to the light-facing portion may be different. As shown in FIG. 8, the plane area occupied by the opening OP adjacent to the light-incident portion with respect to the regions A" and B" indicating the same area may be smaller than the plane area occupied by the opening OP adjacent to the light-facing portion. The area occupied by the opening OP may increase towards the light-facing portion in the light-incident portion.

If the area of the opening OP adjacent to the light-facing portion is large, the amount of light emitted through the opening OP adjacent to the light-facing portion is greater than the amount of light emitted through the opening OP located adjacent to the light-light-incident portion. However, since the amount of light incident from the light source 242 at the light-incident portion is large, the amount of light emitted through the low refractive index layer 273 may be large even though the light is not emitted through the opening OP. The amount of light emitted from the entire light guide 271 may be uniform.

Figure 9:
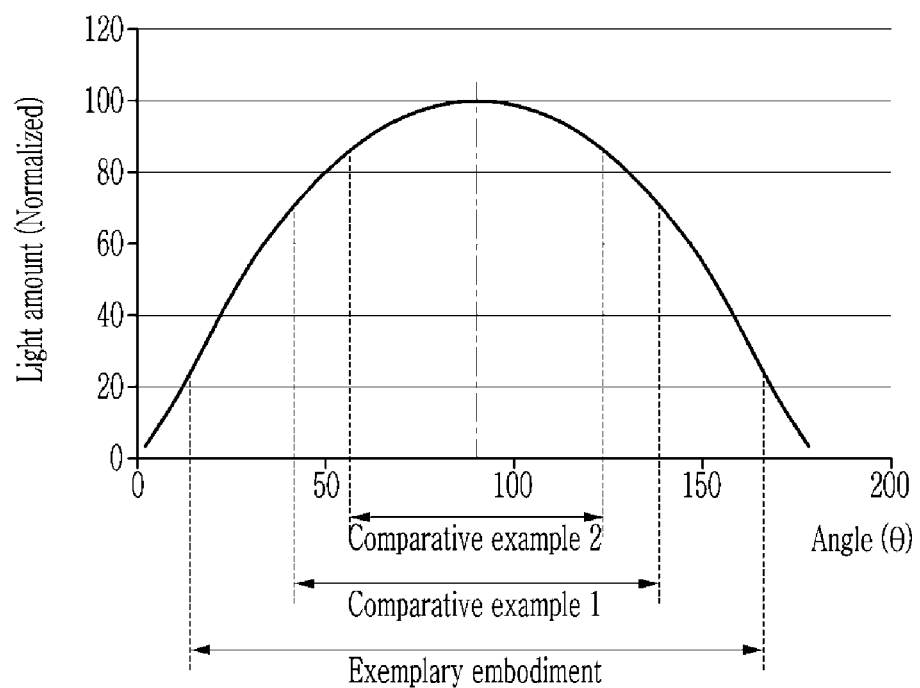
FIG. 9 is a graph of an exemplary embodiment and a comparative example of a light amount.
Figure 10:
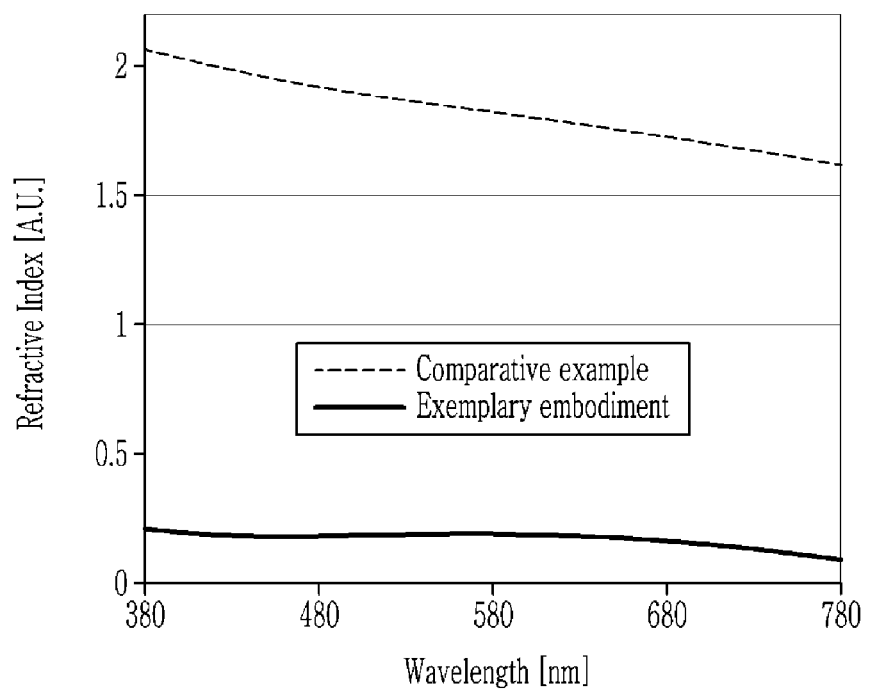
FIG. 10 is a graph showing an exemplary embodiment of a refractive index of a low refractive index layer.
Figure 11:
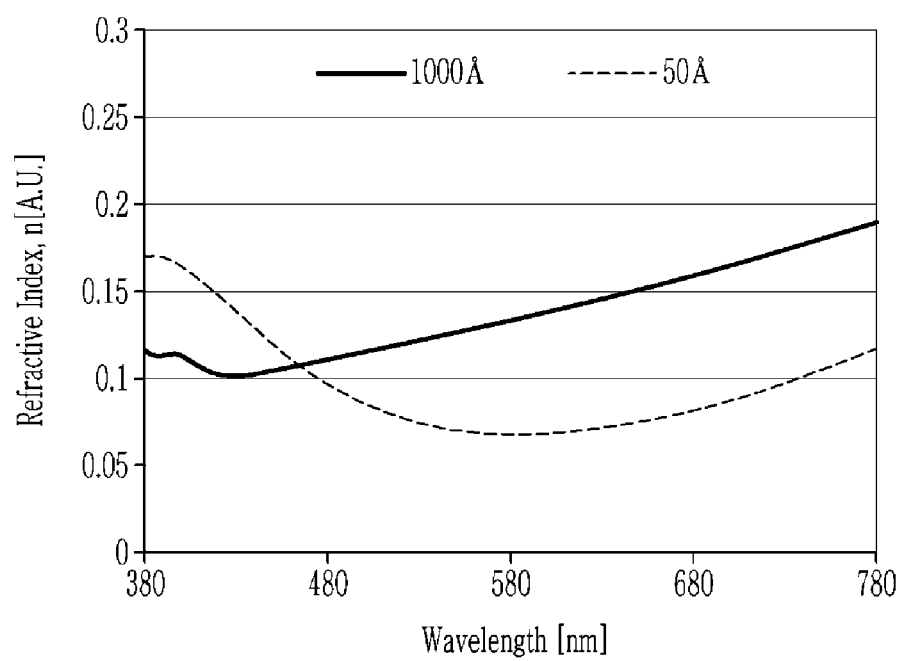
FIG. 11 is a graph showing an exemplary embodiment of a refractive index of a low refractive index layer.
Figure 12:
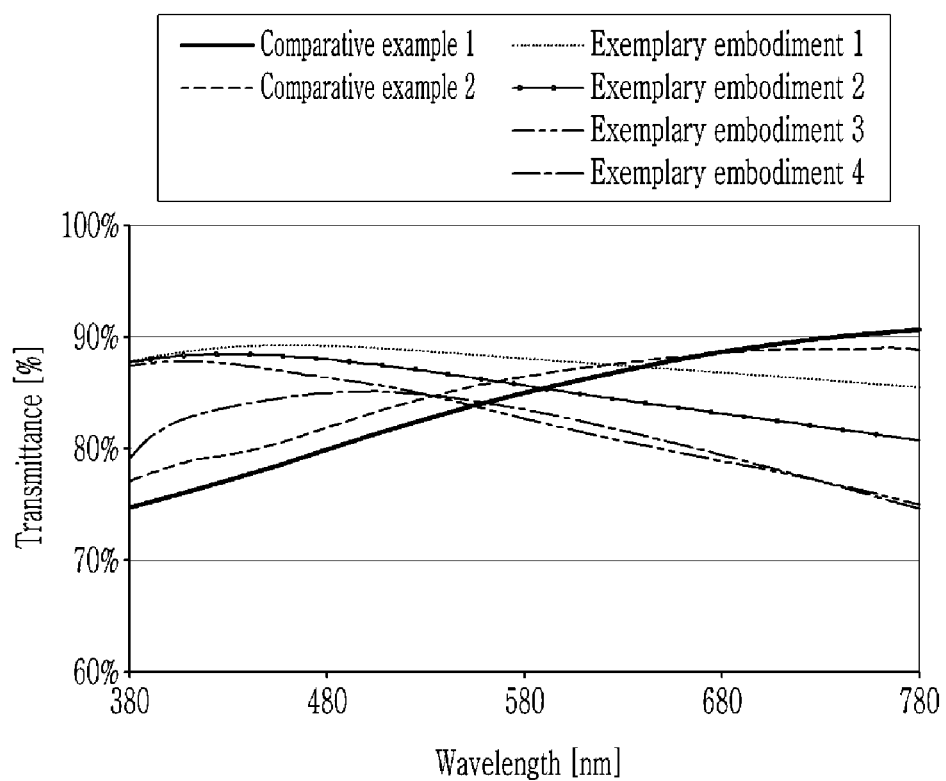
FIG. 12 is a graph showing an exemplary embodiment and a comparative example of transmittance.

Next, an exemplary embodiment and a comparative example are described with reference to FIGS. 9 to 12. FIG. 9 is a graph of an exemplary embodiment and a comparative example of a light amount, FIG. 10 is a graph showing an exemplary embodiment of a refractive index of a low refractive index layer, FIG. 11 is a graph showing an exemplary embodiment of a refractive index of a low refractive index layer, and FIG. 12 is a graph showing an exemplary embodiment and a comparative example of transmittance.

First, a light emission amount according to the exemplary embodiment and the comparative example is described with reference to FIG. 9. The exemplary embodiment relates to an optical member including the low refractive index layer (refractive index of 0.2) including silver (Ag) as above-described and a light guide (refractive index of 1.49) of the glass material, Comparative Example 1 relates to an optical member including the air layer (refractive index of 1) disposed at the same position as the low refractive index layer and the light guide (refractive index of 1.49) of the glass material, and Comparative Example 2 relates to an optical member including the low refractive index layer (refractive index of 1.25) including the organic material and the light guide (refractive index of 1.49) of the glass material.

The threshold angle is about 8 degrees in the case of the exemplary embodiment, the threshold angle is about 42 degrees in the case of Comparative Example 1, and the threshold angle is about 57 degrees in the case of Comparative Example 2. In the case of the illustrative embodiment, the range in which the light is capable of being totally reflected and guided within the light guide is from 8 degrees to 172 degrees, the range is from 42 degrees to 138 degrees in the case of Comparative Example 1, and the range is from 57 degrees to 123 degrees in the case of Comparative Example 2. Since the totally reflected light is reflected by the pattern sheet or the reflection sheet and is finally provided to the wavelength conversion layer, as the light amount of the total reflection is increased, the light amount provided to the wavelength conversion layer may be increased.

The guidable angle range for the exemplary embodiment, Comparative Example 1, and Comparative Example 2 is shown in the graph of FIG. 9, and it may be confirmed that the amount of the light finally emitted though the total reflection is considerably higher in the exemplary embodiment compared with Comparative Example 1 and Comparative Example 2. The case of the exemplary embodiment may provide light of a considerable large amount to the wavelength conversion layer.

Next, referring to FIG. 10, in the case of the low refractive index layer including silver (Ag) according to the exemplary embodiment, it may be confirmed that it has a refractive index corresponding to about 0.2 degree in the wavelength range of 380 nanometers to 780 nanometers. In contrast, in the case of the comparative example including ITO, the refractive index of about 1.6 to about 2 appears in the wavelength range of 380 nanometers to 780 nanometers. That is, it is confirmed that the low refractive index layer including the metal such as silver (Ag) has a considerably lower refractive index in the wide wavelength range.

Also, referring to FIG. 11, it is confirmed that the low refractive index layer having the thickness of 50 angstroms and including silver (Ag) and the low refractive index layer having the thickness of 1000 angstroms and including silver (Ag) have refractive indexes between about 0.1 and 0.15 in the wavelength range of 480 nanometers. Like an exemplary embodiment, when the low refractive index layer includes silver (Ag), it is confirmed that it has a considerably lower refractive index. Particularly, it is confirmed that the low refractive index layer has a considerably lower refractive index in the light wavelength range provided by the LED.

Referring to FIG. 12, Exemplary Embodiment 1 includes the silver (Ag) thin film of a 30 angstrom thickness, Exemplary Embodiment 2 includes the silver thin film of a 40 angstrom thickness, Exemplary Embodiment 3 includes the silver thin film of a 50 angstrom thickness, Exemplary Embodiment 4 includes the silver thin film of a 50 angstrom thickness, and Comparative Example 1 and Comparative Example 2 respectively include the ITO thin film of a 500 angstrom thickness.

It may be confirmed that Exemplary Embodiment 1 to Exemplary Embodiment 4 have higher transmittance than the ITO thin film for blue light of about a 480 nanometer wavelength range. According to an exemplary embodiment, even when the low refractive index layer includes the metal, it is confirmed that blue light is sufficiently transmitted when the thickness is sufficiently small.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light unit comprising:
    a light source and an optical member which transmits and converts light emitted from the light source, the optical member including:
    a light guide;
    a low refractive index layer disposed on the light guide and having a smaller refractive index than that of the light guide; and a wavelength conversion layer disposed on the low refractive index layer and including quantum dots, wherein the low refractive index layer includes a metal.

2. The light unit of claim 1, wherein a thickness of the low refractive index layer is about 30 angstroms to about 100 angstroms.

3. The light unit of claim 1, wherein the low refractive index layer includes at least one among silver (Ag), aluminum (Al), a copper-zinc (Cu—Zn) alloy, copper (Cu), and gold (Au).

4. The light unit of claim 1, wherein the optical member further includes a first capping layer disposed between the low refractive index layer and the wavelength conversion layer.

5. The light unit of claim 4, wherein the first capping layer includes at least one among a silicon nitride, a silicon oxide, an aluminum oxide, and a transparent metal oxide.

6. The light unit of claim 4, wherein the first capping layer includes argon (Ar).

7. The light unit of claim 1, wherein an opening is defined in the low refractive index layer.

8. The light unit of claim 7, wherein the low refractive index layer includes a plurality of regions having different densities from an area occupied by the opening.

9. The light unit of claim 7, wherein the optical member includes a light-incident portion adjacent to the light source and a light-facing portion separated from the light-incident portion, and an area occupied by an opening adjacent to the light-incident portion is smaller than an area occupied by an opening adjacent to the light-facing portion.

10. The light unit of claim 7, wherein the optical member includes a light-incident portion adjacent to the light source and a light-facing portion separated from the light-incident portion, and a number of openings adjacent to the light-incident portion is less than a number of openings adjacent to the light-facing portion.

11. A display device comprising
a display panel; and
a light unit which supplies light to the display panel, the light unit including:
a light source; and
an optical member which transmits and converts the light emitted from the light source, the optical member including:
a light guide;
a low refractive index layer disposed on the light guide and including a metal; and
a wavelength conversion layer disposed on the low refractive index layer and including a quantum dot, wherein a refractive index of the low refractive index layer is 1 or less.

12. The display device of claim 11, wherein a threshold angle of the light incident from the light guide to the low refractive index layer is 10 degrees or less.

13. The display device of claim 11, wherein a thickness of the low refractive index layer is about 30 angstroms to about 100 angstroms.

14. The display device of claim 11, wherein the optical member further includes a first capping layer disposed between the low refractive index layer and the wavelength conversion layer.

15. The display device of claim 14, wherein the first capping layer includes at least one among a silicon nitride, a silicon oxide, an aluminum oxide, and a transparent metal oxide.

16. The display device of claim 14, wherein the first capping layer includes argon (Ar).

17. The display device of claim 11, wherein an opening is defined in the low refractive index layer.

18. The display device of claim 17, wherein the low refractive index layer includes a plurality of regions having different densities from an area occupied by the opening.

19. The display device of claim 17, wherein the optical member includes a light-incident portion adjacent to the light source and a light-facing portion separated from the light-incident portion, and an area occupied by an opening adjacent to the light-incident portion is smaller than an area occupied by an opening adjacent to the light-facing portion.

20. The display of claim 17, wherein the optical member includes a light-incident portion adjacent to the light source and a light-facing portion separated from the light-incident portion, and a number of openings adjacent to the light-incident portion is less than a number of openings adjacent to the light-facing portion.

* * * * *